United States Patent
Wesley et al.

(10) Patent No.: US 12,018,555 B2
(45) Date of Patent: Jun. 25, 2024

(54) PHYSICAL PARAMETER PROJECTION FOR WELLBORE DRILLING

(71) Applicant: Landmark Graphics Corporation, Houston, TX (US)

(72) Inventors: Avinash Wesley, New Caney, TX (US); Robello Samuel, Cypress, TX (US); Manish K. Mittal, Cypress, TX (US)

(73) Assignee: Landmark Graphics Corporation, Houston, TX (US)

( * ) Notice: Subject to any disclaimer, the term of this patent is extended or adjusted under 35 U.S.C. 154(b) by 821 days.

(21) Appl. No.: 17/054,629

(22) PCT Filed: Mar. 26, 2020

(86) PCT No.: PCT/US2020/024910
§ 371 (c)(1),
(2) Date: Nov. 11, 2020

(87) PCT Pub. No.: WO2021/194494
PCT Pub. Date: Sep. 30, 2021

(65) Prior Publication Data
US 2023/0095708 A1 Mar. 30, 2023

(51) Int. Cl.
*E21B 44/00* (2006.01)
*E21B 47/007* (2012.01)
*G06F 30/20* (2020.01)

(52) U.S. Cl.
CPC ............ *E21B 44/00* (2013.01); *E21B 47/007* (2020.05); *E21B 2200/20* (2020.05); *G06F 30/20* (2020.01)

(58) Field of Classification Search
CPC ...................................................... E21B 12/02
See application file for complete search history.

(56) References Cited

U.S. PATENT DOCUMENTS

| | | | | |
|---|---|---|---|---|
| 4,549,431 A | * | 10/1985 | Soeiinah | E21B 44/00 702/9 |
| 5,952,569 A | * | 9/1999 | Jervis | E21B 47/10 73/152.01 |

(Continued)

FOREIGN PATENT DOCUMENTS

| | | | | |
|---|---|---|---|---|
| CA | 3105556 A1 | * | 9/2021 | E21B 44/00 |
| CA | 3105556 C | * | 2/2023 | E21B 44/00 |

(Continued)

OTHER PUBLICATIONS

Yu, Hao, Arash Dahi Taleghani, and Zhanghua Lian. "Modelling casing wear at doglegs by incorporating alternate accumulative wear." Journal of Petroleum Science and Engineering 168 (2018): 273-282. (Year: 2018).*

(Continued)

*Primary Examiner* — Akash Saxena
(74) *Attorney, Agent, or Firm* — Kilpatrick Townsend & Stockton LLP

(57) ABSTRACT

Aspects and features of this disclosure relate to projecting physical drilling parameters to control a drilling operation. A computing system applies Bayesian optimization to a model incorporating the input data using varying values for an adverse drilling factor to produce a target function. The computing system determines a minimum value for the target function. The computing system provides a projected value for the physical drilling parameters based on the minimum value. The computing system generates an alert responsive to determining that the projected value for the physical drilling parameters exceeds a prescribed limit.

14 Claims, 8 Drawing Sheets

(56) References Cited

U.S. PATENT DOCUMENTS

| | | | |
|---|---|---|---|
| 9,202,169 B2 | 12/2015 | Al-Yami et al. | |
| 10,487,640 B2* | 11/2019 | Aniket | E21B 7/04 |
| 2010/0185395 A1* | 7/2010 | Pirovolou | E21B 44/00 |
| | | | 702/9 |
| 2013/0277112 A1* | 10/2013 | Edbury | E21B 37/00 |
| | | | 175/27 |
| 2014/0297235 A1 | 10/2014 | Arora et al. | |
| 2014/0326449 A1* | 11/2014 | Samuel | E21B 41/00 |
| | | | 340/853.3 |
| 2015/0134257 A1* | 5/2015 | Erge | E21B 47/00 |
| | | | 702/9 |
| 2016/0237810 A1* | 8/2016 | Beaman, Jr. | E21B 47/10 |
| 2016/0326844 A1* | 11/2016 | Samuel | G06F 30/00 |
| 2017/0306726 A1* | 10/2017 | Alzahrani | G06F 30/20 |
| 2018/0171774 A1* | 6/2018 | Ringer | E21B 47/002 |
| 2019/0136682 A1 | 5/2019 | Benson et al. | |
| 2019/0345809 A1* | 11/2019 | Jain | E21B 47/26 |
| 2020/0240257 A1* | 7/2020 | Madasu | E21B 44/00 |
| 2021/0404313 A1* | 12/2021 | Saidutta | E21B 41/00 |
| 2022/0316278 A1* | 10/2022 | Pandya | E21B 7/04 |
| 2023/0039147 A1* | 2/2023 | Gutarov | G06F 30/13 |
| 2023/0054050 A1* | 2/2023 | Samuel | E21B 44/00 |
| 2023/0059507 A1* | 2/2023 | Samuel | E21B 44/00 |
| 2023/0175380 A1* | 6/2023 | Aljubran | E21B 44/00 |
| | | | 703/10 |

FOREIGN PATENT DOCUMENTS

| | | | | |
|---|---|---|---|---|
| GB | 2595549 A * | 12/2021 | | E21B 44/04 |
| WO | 2006053294 | 5/2006 | | |
| WO | 2009039448 | 3/2009 | | |
| WO | 2019040091 | 2/2019 | | |
| WO | 2019118055 | 6/2019 | | |
| WO | WO-2019118055 A1 * | 6/2019 | | E21B 44/00 |
| WO | 2019147297 | 8/2019 | | |
| WO | WO-2021040774 A1 * | 3/2021 | | E21B 44/00 |

OTHER PUBLICATIONS

Ding L, Xian M, Zhang Q. Prediction of casing wear depth and residual strength in highly-deviated wells based on modeling and simulation. Science Progress. 21 Pgs., 2020;103(4). (Year: 2020).*
Application No. PCT/US2020/024910, International Search Report and Written Opinion, Mailed On Dec. 18, 2020, 10 pages.
GB Application No. GB2102397.3, "Combined Search and Examination Report", Oct. 1, 2021, 7 pages.

* cited by examiner

PHYSICAL PARAMETER PROJECTION FOR WELLBORE DRILLING

TECHNICAL FIELD

The present disclosure relates generally to wellbore drilling. More specifically, but not by way of limitation, the present disclosure relates to determining physical drilling parameters to control the drilling operation.

BACKGROUND

A wellbore can be formed by drilling through a subterranean formation. During drilling, conditions inside the subterranean formation can continuously change. For example, the formation through which a wellbore is drilled exerts a variable force on the drill bit. This variable force can be due to the rotary motion of the drill bit, the weight applied to the drill bit, and the friction characteristics of each strata of the formation. A drill bit may pass through many different materials, rock, sand, shale, clay, etc., in the course of forming the wellbore and adjustments to various drilling parameters are sometimes made during the drilling process by a drill operator to account for observed friction and wear experienced by drilling equipment. Sometimes the effects of these adjustments are delayed significantly due to drilling fluid inertia, drill pipe elasticity, and distance. The drill operator can make adjustments based on experience coupled with these observations, and knowledge of the depth of the drilling tool, type of drillstring, and type of formation.

DETAILED DESCRIPTION

Figure 1:
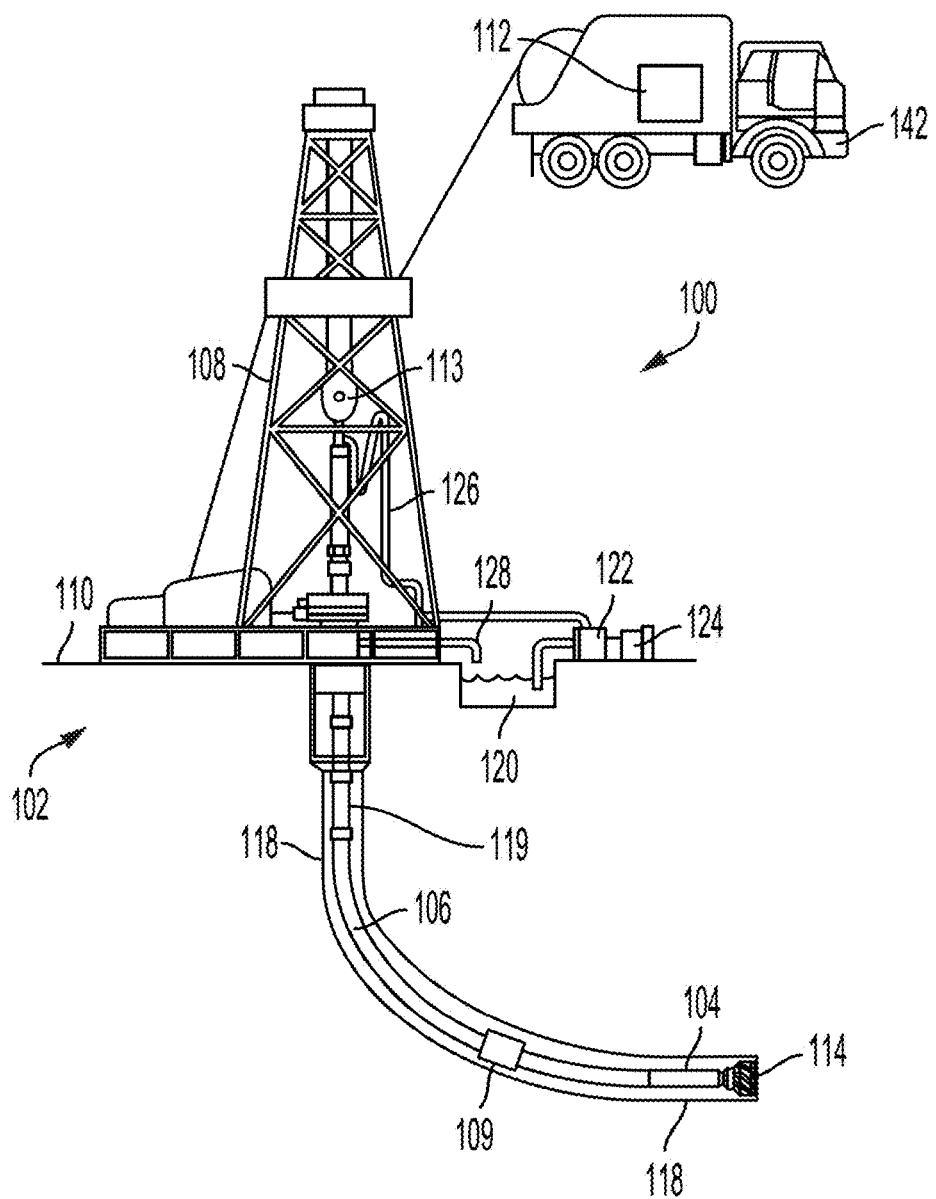
FIG. 1 is a cross-sectional view of an example of a drilling system that includes physical drilling parameter projection, according to some aspects of the disclosure.

Certain aspects and features relate to projecting physical drilling parameters for controlling wellbore drilling operations. During a drilling operation, a mud motor and a drillstring encounter various drilling factors that indicate the downhole condition. For instance, the drillstring may encounter different rock formations and different layers within a rock formation. As the drilling operation progresses, hook loads, torques, and casing wear values change based on the downhole conditions. Hook load is related to the weight of the drilling components including the drillstring. Casing wear is an amount of casing that has been removed by the rotating and sliding drillstring. Accurately projecting physical drilling parameters identifies and prevents failures in the wellbore planning process. Accurately projecting physical drilling parameters also generates alerts during wellbore drilling operations to identify degrading downhole conditions and prevent physical drilling parameters such as casing wear, hook load, and torque from exceeding prescribed limits.

Traditional drilling techniques for managing physical drilling parameters rely on observing data and reacting to downhole conditions. In one example, observed changes in hook load may be caused by the friction acting on the drillstring. In another example, observed changes in casing wear may be due to changes in downhole conditions or mechanical differences from a wellbore plan.

However, projection of accurate physical drilling parameters may achieve a successful and safe drilling operation by alerting drilling operators to downhole conditions that are deviating from planned conditions. Predicting physical drilling parameters may be achieved in a wellbore planning process using similar previous wellbore drilling operations or during a real-time drilling operation using well survey data and historical information of the current well drilling operation. During a planning operation, detecting that the casing wear value exceeds a mechanical limit of the planned casing thickness can alert an operator to redesign attributes of the planned wellbore. During real-time prediction of physical drilling parameters, prediction of accurate physical drilling parameters can alert an operator to downhole conditions that may preclude a successful and safe drilling operation and allow the operator to perform remedial actions prior to a failure of the drilling operation (e.g., a casing wear in excess of the casing thickness, a hook load that exceeds the hook load limit of the derrick, etc.).

Some aspects and features use data analytics and uncertainty analysis to project various physical drilling parameters during wellbore planning and during a drilling operation. In some examples, a system includes at least one sensor for a drillstring in a wellbore and a mud motor communicatively coupled to a drillstring. The system also includes a computing device communicatively coupled to the sensor and the motor. A processing device receives input data at least in part for an offset wellbore. The input data includes one or more of string data, casing data, hole data, well path survey information, fluid data, or operation data. The processing device applies Bayesian optimization to a model incorporating the input data. The Bayesian optimization uses varying values for an adverse drilling factor (e.g., friction factor) to produce a target function and determines an optimized (e.g., a minimum) value for the target function to provide a projected value for the each physical drilling parameter based on the minimum value. The processing device in some examples generates an alert if the projected value for the physical drilling parameter exceeds a prescribed limit.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

FIG. 1 is a cross-sectional view of an example of a drilling system 100 that includes physical drilling parameters projection according to some aspects of the disclosure. A wellbore of the type used to extract hydrocarbons from a formation may be created by drilling into the earth 102 using the drilling system 100. The drilling system 100 may be configured to drive a bottom hole assembly (BHA) 104 positioned or otherwise arranged at the bottom of a drillstring 106 extended into the earth 102 from a derrick 108 arranged at the surface 110. The derrick 108 includes a kelly 113 used to lower and raise the drillstring 106. The BHA 104 may include a drill bit 114 operatively coupled to a drillstring 106, which may be moved axially within a drilled wellbore 118 as attached to the drillstring 106. Drillstring 106 may include one or more sensors 109, for determining conditions in the wellbore. The sensors can send signals to the surface 110 via a wired or wireless connection (not shown). The combination of any support structure (in this example, derrick 108), any motors, electrical equipment, and support for the drillstring and tool string may be referred to herein as a drilling arrangement.

During operation, the drill bit 114 penetrates the earth 102 and thereby creates the wellbore 118. The BHA 104 provides control of the drill bit 114 as it advances into the earth 102. Control of the drill bit includes rotating and sliding as induced by a motor 119, which in some examples, is a mud motor. A mud motor is part of the drillstring and can use, at least in part, the hydraulic power of the drilling fluid to operate. Fluid or "mud" from a mud tank 120 may be pumped downhole using a mud pump 122 powered by an adjacent power source, such as a prime mover or motor 124. The mud may be pumped from the mud tank 120, through a stand pipe 126, which feeds the mud into the drillstring 106 and conveys the same to the drill bit 114. The mud exits one or more nozzles (not shown) arranged in the drill bit 114 and in the process, cools the drill bit 114. After exiting the drill bit 114, the mud circulates back to the surface 110 via the annulus defined between the wellbore 118 and the drillstring 106, and in the process returns the drill cuttings and debris to the surface. The cuttings and mud mixture are passed through a flow line 128 and are processed such that a cleaned mud is returned downhole through the stand pipe 126 once again.

Still referring to FIG. 1, the drilling arrangement and any sensors (through the drilling arrangement or directly) are connected to a computing device 112. In FIG. 1, the computing device 112 is illustrated as being deployed in a work vehicle 142. However, a computing device to receive data from sensors and to control drill bit 114 can be permanently installed with the drilling arrangement, be hand-held, or be remotely located. In some examples, the computing device 112 can process at least a portion of the data received and can transmit the processed or unprocessed data to another computing device (not shown) via a wired or wireless network. Either or both computing devices can perform the operations described herein for projecting physical drilling parameters, generating alerts to presentation devices, and applying control parameters movement of the mud motor or drill bit. The computing device 112 can be positioned belowground, aboveground, onsite, in a vehicle, offsite, etc. The computing device 112 can include a processing device interfaced with other hardware via a bus. A memory, which can include any suitable tangible (and non-transitory) computer-readable medium, such as RAM, ROM, EEPROM, or the like, can embody program components that configure operation of the computing device 112. A more specific example of the computing device 112 is described in greater detail below with respect to FIG. 2.

Figure 2:
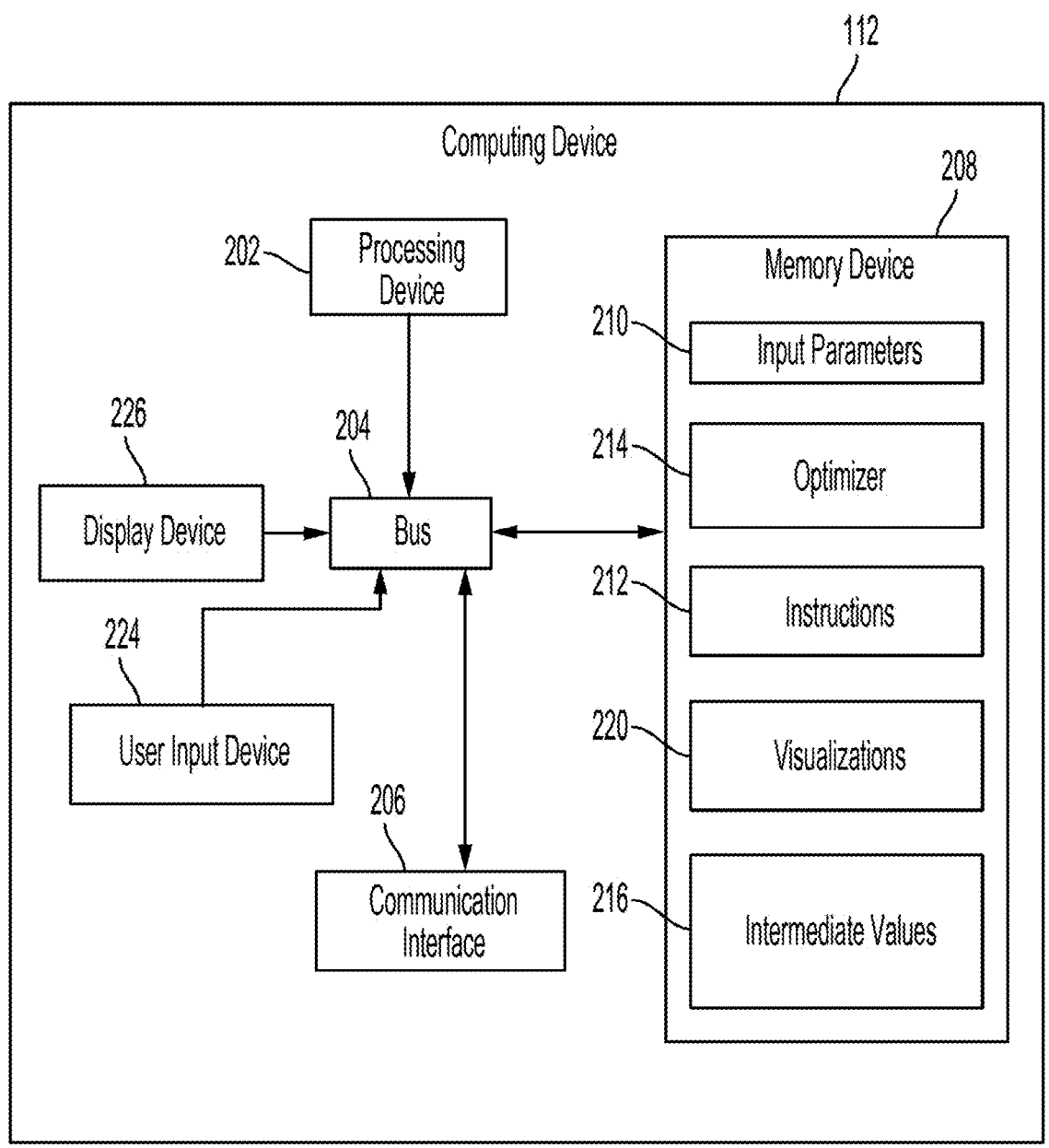
FIG. 2 is a block diagram of a computing system for projecting a physical drilling parameter, according to some aspects of the disclosure.

FIG. 2 is a block diagram of a computing system for projecting an physical drilling parameter, according to some aspects of the disclosure. The computing device 112 can include a processing device 202, a bus 204, a communication interface 206, a memory device 208, a user input device 224, and a display device 226. In some examples, some or all of the components shown in FIG. 2 can be integrated into a single structure, such as a single housing. In other examples, some or all of the components shown in FIG. 2 can be distributed (e.g., in separate housings) and in communication with each other.

The processing device 202 can execute one or more operations for controlling a drilling operation or displaying data and information about the drilling operations, projecting and forecasting drilling forces and conditions, analysis of forces on a drillstring or motor, etc. The processing device 202 can execute instructions stored in the memory device 208 to perform the operations. The processing device 202 can include one processing device or multiple processing devices. Non-limiting examples of the processing device 202 include a Field-Programmable Gate Array ("FPGA"), an application-specific integrated circuit ("ASIC"), a microprocessing device, etc.

The processing device 202 can be communicatively coupled to the memory device 208 via the bus 204. The non-volatile memory device 208 may include any type of memory device that retains stored information when powered off. Non-limiting examples of the memory device 208 include electrically erasable and programmable read-only memory ("EEPROM"), flash memory, or any other type of non-volatile memory. In some examples, at least some of the memory device 208 can include a non-transitory medium from which the processing device 202 can read executable instructions. A computer-readable medium can include electronic, optical, magnetic, or other storage devices capable of providing the processing device 202 with computer-readable instructions or other program code. Non-limiting examples of a computer-readable medium include (but, are not limited to) magnetic disk(s), memory chip(s), read-only memory ("ROM"), random-access memory ("RAM"), an ASIC, a configured processing device, optical storage, or any other medium from which a computer processing device can read instructions. The instructions can include processing device-specific instructions generated by a compiler or an interpreter from code written in any suitable computer-programming language, including, for example, C, C++, C#, etc.

In some examples, the memory device 208 can include input parameters 210, received from sensor 109 or other sensors. In some examples, the memory device 208 can include computer program code instructions 212 for calculating hook loads and torque values, determining friction, and projecting physical drilling parameters. Some or all of the results of these calculations can be stored as intermediate values 216. The memory device 208 can store instructions for the optimizer 214 for use in computing target functions and adjusting parameters to minimizing the adverse drilling factors. The memory device 208 can include visualizations 220, for display to a user. In certain examples, visualization can include displayed graphs of forecasted values for physical drilling parameters, displayed alerts, and the like. The computing device can present the various visualizations on the display device 226.

In some examples, the computing device 112 includes a communication interface 206. The communication interface 206 can represent one or more components that facilitate a network connection or otherwise facilitate communication between electronic devices. Examples include, but are not limited to, wired interfaces such as Ethernet, USB, IEEE 1394, and/or wireless interfaces such as IEEE 802.11, Bluetooth, near-field communication ("NFC") interfaces, RFID interfaces, or radio interfaces for accessing cellular telephone networks (e.g., transceiver/antenna for accessing a CDMA, GSM, UMTS, or other mobile communications network). In some examples, the computing device 112 includes a user input device 224. The user input device 224 can represent one or more components used to input data. Examples of the user input device 224 can include a keyboard, mouse, touchpad, button, or touch-screen display, etc. In some examples, the computing device 112 includes a display device 226. The display device 226 can represent one or more components used to output data. Examples of the display device 226 can include a liquid-crystal display ("LCD"), a computer monitor, a touch-screen display, etc. In some examples, the user input device 224 and the display device 226 can be a single device, such as a touch-screen display. The display device can be used to display visualizations 220.

Figure 3:
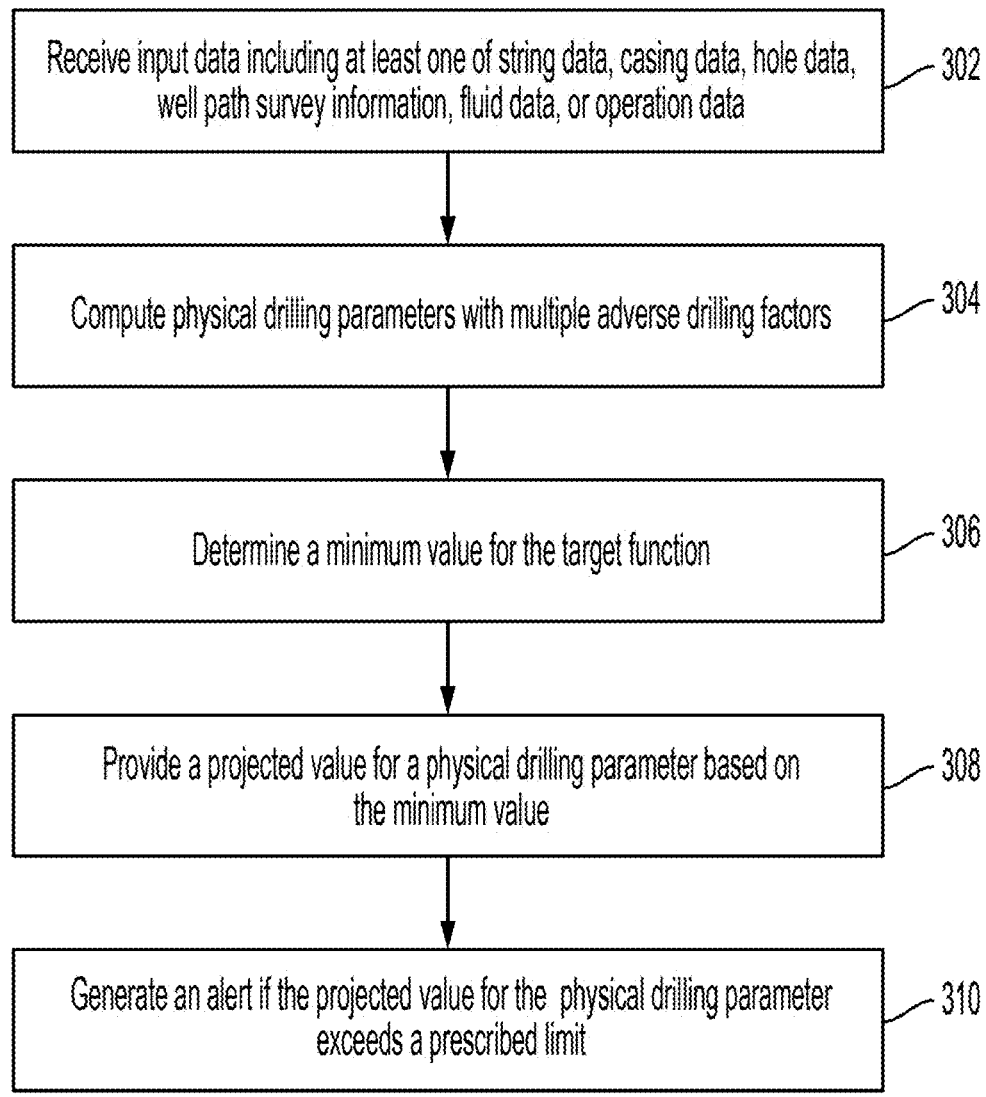
FIG. 3 is a flowchart of a process for projecting physical drilling parameters, according to some aspects of the disclosure.

FIG. 3 is a flowchart of a process 300 for projecting physical drilling parameters, according to some aspects of the disclosure. For example, processing device 202 of the computing device 112 may generate alerts (i.e., an audible, visual, or other alarm) for projected physical drilling parameters that exceed a prescribed limit.

At block 302, the processing device 202 receives input data. In one example, the processing device 202 may receive input data from a stored set of input parameters 210. The input parameters may include string data, hole data, casing data, downhole conditions (e.g., temperature, rock formation parameters, pressure, etc.), well path survey information, fluid data, and operation data. At least some of this data comes from a wellbore or wellbores that are offset from the location of the new wellbore that is planned or being drilled. In another example, the processing device can receive input data from sensor 109. The processing device may receive the information via the communication interface 206, which can be a wired or wireless communication interface.

At block 304, the processing device 202 applies an optimizer 214 to the input data. In one example, the optimizer 214 may compute a projected friction factor by computing hook load and torque values from input parameters 210 and applying Bayesian Optimization. The optimizer 214 may compute the hook load and torque values a predetermined number of times, in some cases approximately 30-50 iterations, with each iteration having a different friction factor. The optimizer 214 may count the number of iterations with the quantity of iterations stored as n iterations.

At block 306, the processing device 202 determines a minimum value for a target function. A target function is an objective function that is optimized to compare the predicted hook load values to the actual measured hook load. In one example, the predicted hook load values may be compared to the actual measured hook load by computing the difference between the actual measured hook load received from sensor 109 with the predicted hook load.

In another example where the target function is minimized, the target function can be used to project both hook load calculations and torque calculations. The target function for friction factor may be either a root-mean-square ("RMS") computation or an absolute computation. For example, a minimization of the target function (RMS) for can be represented as:

$$= \sqrt{\left(HL_1^{actual}-HL_1^{predicted}\right)^2+\left(HL_2^{actual}-HL_2^{predicted}\right)^2+\ldots+\left(HL_n^{actual}-HL_n^{predicted}\right)^2+ \left(T_1^{actual}-T_1^{predicted}\right)^2+\left(T_2^{actual}-T_2^{predicted}\right)^2+\ldots+\left(T_n^{actual}-T_n^{predicted}\right)^2}$$

In the equation above, HL represents the actual (i.e., measured) or predicted (i.e., calculated) hook load values for each iteration up to and including n iterations. The torque value is represented by T and is computed in a similar manner by comparing the actual torque and the predicted torque for n iterations.

In another example, the friction factor may be computed using an absolute target function. For example, an absolute target function may be represented as:

$$=|HL_1^{actual}-HL_1^{predicted}|+|HL_2^{actual}-HL_2^{predicted}|+ |HL_n^{predicted}|+|T_1^{actual}-T_1^{predicted}|+|T_2^{actual}-T_2^{predicted}|+|T_n^{actual}-T_n^{predicted}|.$$

At block 308, the processing device 202 provides a projected value for the physical drilling parameter based on the minimum value of the target function. The physical drilling factor may be any characteristic of the wellbore which indicates the efficiency and safety of the drilling operation. In some examples, the physical drilling parameter is a casing wear, a hook load, a torque value, or other parameters that can be used to determine an efficacy of a drilling operation. The projected value of the physical drilling parameter may also be computed from an optimized target function (e.g., an optimization other than a minimization of the target function).

At block 310, the processing device 202 generates an alert if the projected value for the physical drilling parameter exceeds a prescribed limit. For instance, the memory device may store threshold values for various physical drilling parameters. The threshold values may define a safety or efficacy threshold for a wellbore. In one example, an physical drilling parameter may be a wellbore drilling operation parameter including a hook load value, a casing wear value, or a torque value. The processing device 202 may compare the physical drilling parameter to a threshold physical drilling parameter continuously, or at intermittent time intervals. The processing device 202 may generate the alert (e.g., a prompt to a user, or another user interface element) that prompts the operator to make an adjustment to the well plan or drilling operation.

Figure 4:
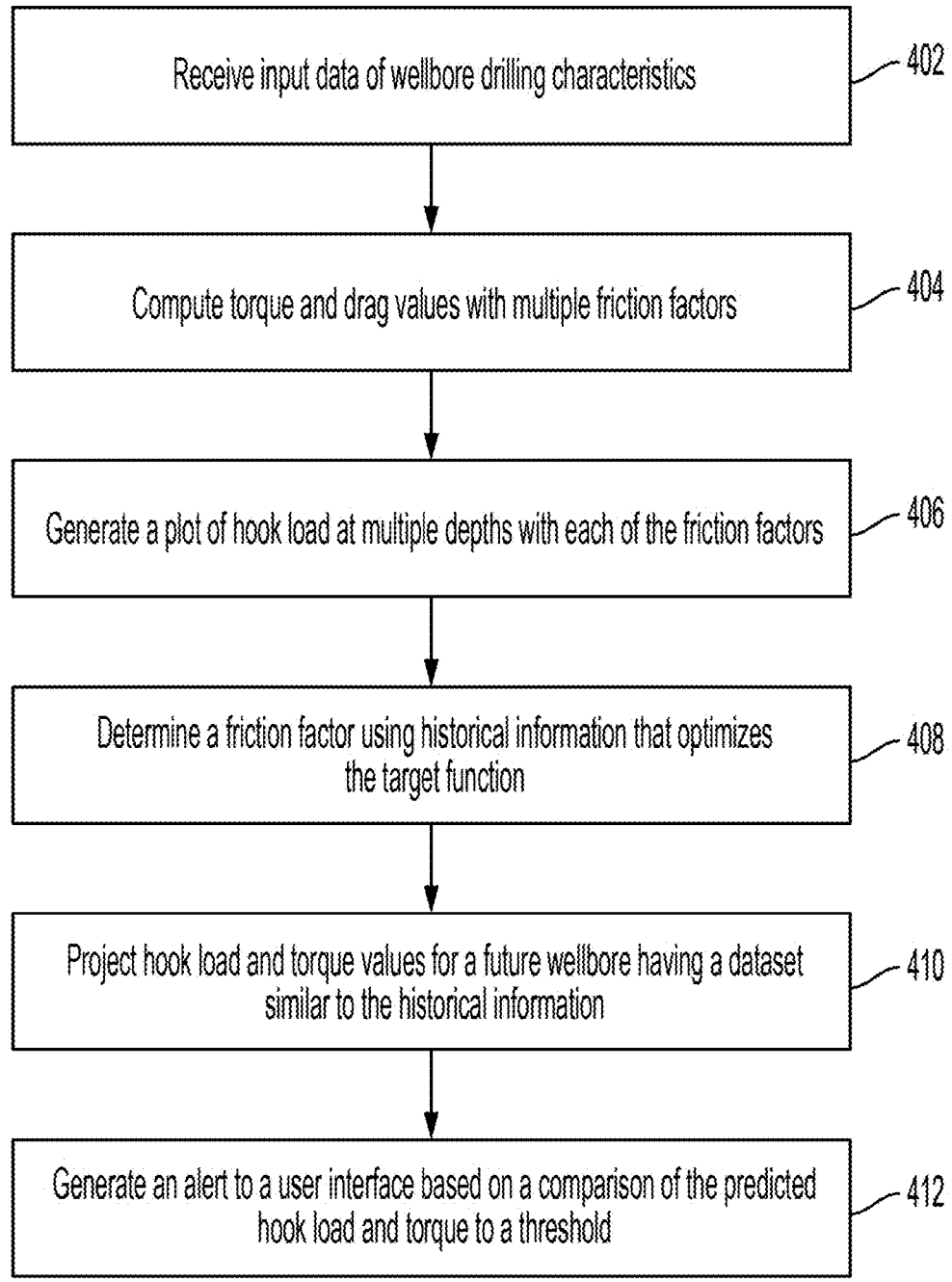
FIG. 4 is a flowchart of a process for projecting hook load and torque values during well planning, according to some aspects of the disclosure.

FIG. 4 is a flowchart of a process for projecting hook load and torque values during wellbore planning, according to some aspects of the disclosure. For example, the computing device 112 may execute a wellbore planning software application for designing and engineering parameters of wellbore simulations. The computing device 112 may use the processor 202 and input parameters 210 to project physical drilling parameters for a wellbore design. The wellbore planning software may provide historical data of multiple wellbores in various regions, depths, and with datasets of measured wellbore characteristics during the respective drilling operations. Such wellbores may be referred to as "offset" wellbores because they are offset from the location where the new wellbore is likely to be formed.

At block 402, the processing device 202 receives input data of wellbore drilling characteristics. For instance, the processing device 202 may access input parameters 210 that include parameters from previous similar well drilling operations. The processing device 202 may determine a previous similar well drilling operation by comparing various attributes of the planned and previous well drilling operations (e.g., location, hole data, string data, well survey data, fluid data, etc.). In some examples, the processing device 202 may receive the input data of wellbore drilling characteristics from another computing system or storage device.

At block 404, the processing device 202 may compute drag (e.g., hook load) and torque values by from input parameters 210 using multiple friction factors. The processing device 202 may use a distribution of friction factors within a predetermined range or may select values for friction factors based on a machine learning model determining an initial friction factor based on input parameters 210 and other similar wellbore drilling operations.

At block 406, the processing device 202 may generate a plot to depict an physical drilling parameter at various depths of the planned wellbore. In an example like that of FIG. 4 where a well plan is being developed, an adverse drilling factor (i.e., friction factor) may be referred to as a static drilling factor because it is not being updated in real time based on a current drilling operation. For example, the processing device 202 may generate a plot of hook load and depth of the wellbore for display on display device 226. The processing device 202 may generate a plot for hook load or torque for each friction factor.

At block 408, the processing device 202 may determine a projected friction factor from the historical information. The processing device 202 may use Bayesian Optimization and either the RMS or absolute target functions for friction factor described with regard to FIG. 3. The processing device 202 can determine the friction factor for which the target function is minimized using Bayesian Optimization. The processing device 202 may store the friction factor in intermediate values 216.

At block 410, the processing device 202 may predict the hook load and torque values for a future wellbore having a dataset similar to the historical information. The processing device 202 may determine that a future wellbore is similar to the historical information as described above. The processing device 202 may use the friction factor, determined by optimizing the target functions of the historical information, to predict hook load and torque values of the future wellbore. The processing device may store the predicted hook load and torque values in intermediate values 216.

At block 412, the processing device 202 generates an alert if the predicted value for the hook loads or torque values are greater than a threshold value of hook load or torque. For instance, the memory device 208 may store threshold values for various physical drilling parameters including hook load, torque, or other factors. The threshold values of hook load and torque may define a safety margin for a wellbore to prevent failures or exceeding structural or material limitations of the wellbore. The processing device 202 may compare the predicted hook load and torque values to a threshold hook load and torque value, respectively. The processing device 202 may generate the alert (e.g., a prompt to a user, or another user interface element) that prompts the operator to make an adjustment to the well plan or drilling operation.

Figure 5:
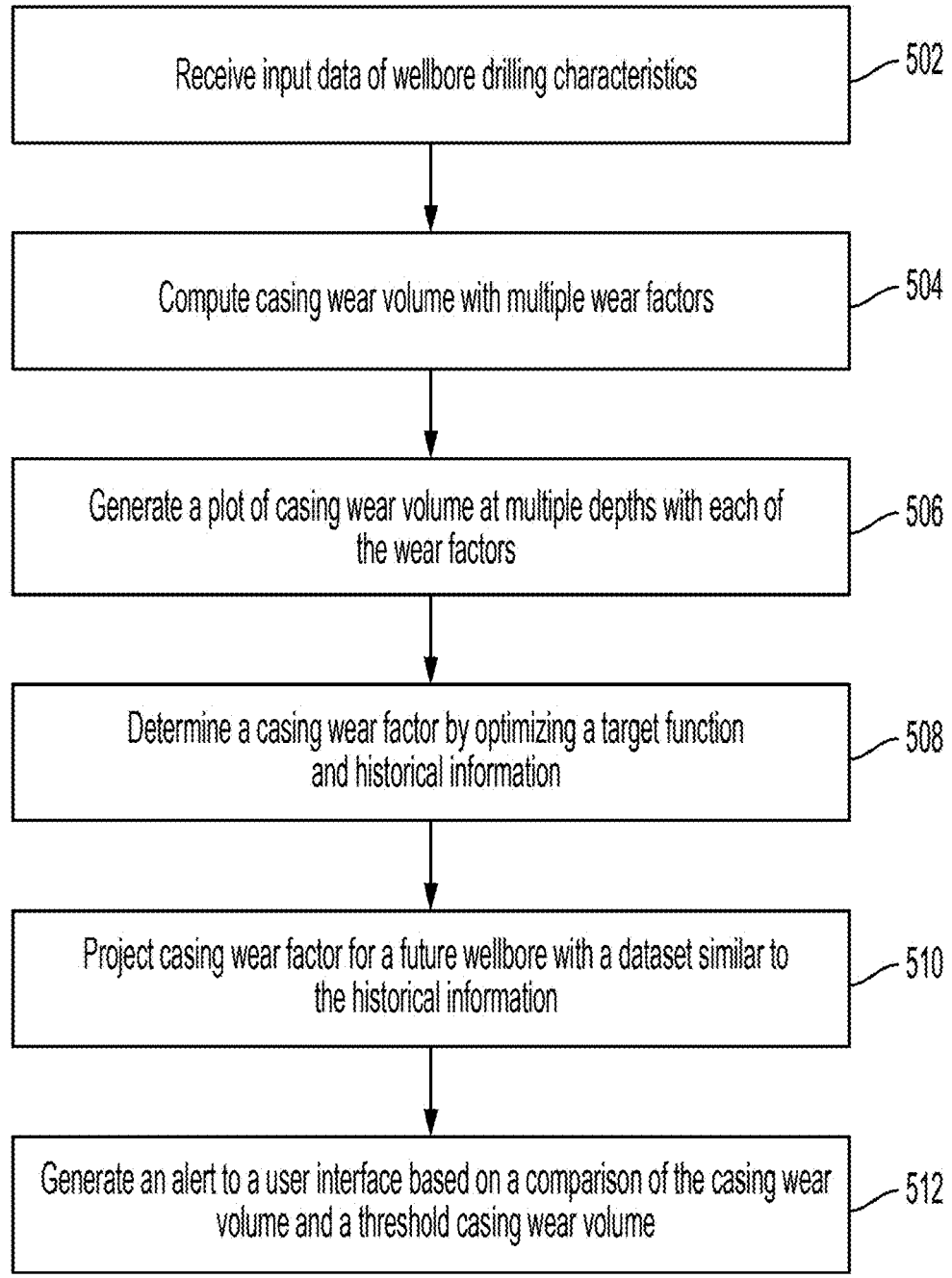
FIG. 5 is a flowchart of a process for projecting casing wear volumes during well planning, according to some aspects of the disclosure.

FIG. 5 is a flowchart of a process for projecting casing wear volumes during well planning, according to some aspects of the disclosure. For example, the computing device 112 may execute a wellbore planning software application for designing and engineering parameters of wellbore simulations. The computing device 112 may use the processor 202 and input parameters 210 to project casing wear volumes for a wellbore design. The wellbore planning software may provide historical data of multiple wellbores in various regions, depths, and with datasets of measured wellbore characteristics during the respective drilling operations.

At block 502, the processing device 202 receives input data of wellbore drilling characteristics. For instance, the processing device 202 may access input parameters 210 that include parameters from previous similar well drilling operations. The processing device 202 may determine a previous similar well drilling operation by comparing various attributes of the planned and previous well drilling operations (e.g., location, well survey data, fluid data, etc.). In some examples, the processing device 202 may receive the input data of wellbore drilling characteristics from another computing system or storage device.

At block 504, the processing device 202 may compute casing wear volume from input parameters 210. A casing wear volume may be a measure of the internal wear of a casing in a drillstring. As the wellbore drilling operation progresses, the casing wear volume generally increases. However, various factors increase or reduce casing wear volume. The casing wear volume may also be computed with multiple wear factors. A wear factor is a ratio of friction factor to the specific energy of the casing material. The casing wear volume may alternatively be represented as a groove depth. The processing device 202 may select a distribution of wear factors within a predetermined range or otherwise select wear factors that may be used in computing the casing wear volume. In one example, the groove depth is a depth of a groove in the casing caused by removal of a portion of the casing by contact with a subterranean rock formation.

At block 506, the processing device 202 may generate a plot to depict casing wear volumes at various depths of the planned wellbore. For example, the processing device 202 may generate a plot of casing wear volume (or alternatively groove depth) of the wellbore for display on display device 226. In one example, the processing device 202 may generate a plot of casing wear volume with multiple wear factors. The processing device 202 may display the plot of casing wear volume on display device 226 or another computing device.

At block 508, the processing device 202 may determine a projected casing wear factor by optimizing a target function and inputting historical information from input parameters 210. The target functions to determine casing wear factor (or alternatively groove depth) may be represented as an RMS or absolute target function similar to the target functions described relating to friction factor. An example of an RMS target function for determining casing wear factor may be represented by:

$$\sqrt{\left(WV_1^{actual} - WV_1^{predicted}\right)^2 + \left(WV_2^{actual} - WV_2^{predicted}\right)^2 + \ldots + \left(WV_n^{actual} - WV_n^{predicted}\right)^2}$$

Similarly, an example of an absolute target function for determining casing wear factor may be represented by:

$$|WV_1^{actual} - WV_1^{predicted}| + |WV_2^{actual} - WV_2^{predicted}| + \cdots + |WV_n^{actual} - WV_n^{predicted}|$$

In another example, the processing device may determine a groove depth factor for the historical information. For example, the processing device may optimize a target functions to determine a groove depth factor of the historical information. The groove depth for the historical data may be computed similar to the casing wear factor. In one example, the groove depth factor may be computed in an RMS representation described by:

$$\sqrt{(GD_1^{actual} - GD_1^{predicted})^2 + (GD_2^{actual} - GD_2^{predicted})^2 + \ldots + (GD_n^{actual} - GD_n^{predicted})^2}.$$

Similarly, the groove depth factor may be computed by an absolute representation described by:

$$|GD_1^{actual} - GD_1^{predicted}| + |GD_2^{actual} - GD_2^{predicted}| + \cdots + |GD_n^{actual} - GD_n^{predicted}|.$$

At block 510, the processing device 202 may predict a casing wear volume for a future wellbore with a dataset similar to the historical information. For example, the processing device may optimize the target functions described above to determine a casing wear volume of the historical information. The processing device 202 may determine that a future wellbore is similar to the historical information based on factors previously discussed such as geographic location, well survey data, etc. The processing device 202 may use the casing wear factor, determined from the historical data of the similar wellbore, to predict casing wear volume on the future wellbore.

In another example, the processing device 202 may determine that a future wellbore is similar to the historical information based on factors previously discussed such as geographic location, well survey data, etc. The processing device 202 may use the groove depth factor, determined from the historical data of the similar wellbore, to predict groove depth on the future wellbore.

At block 512, the processing device 202 generates an alert if the predicted value for the casing wear volume or groove depth is greater than a threshold value of casing wear volume or groove depth. For instance, the memory device 208 may store threshold values for various physical drilling parameters including casing wear volume, groove depth, or other parameters. The threshold values of casing wear volume or groove depth may define a safety margin for a wellbore to prevent failures or exceeding structural or material limitations of the wellbore. The processing device 202 may generate the alert (e.g., a prompt to a user, or another user interface element) that prompts the operator to make an adjustment to the well plan or drilling operation.

Figure 6:
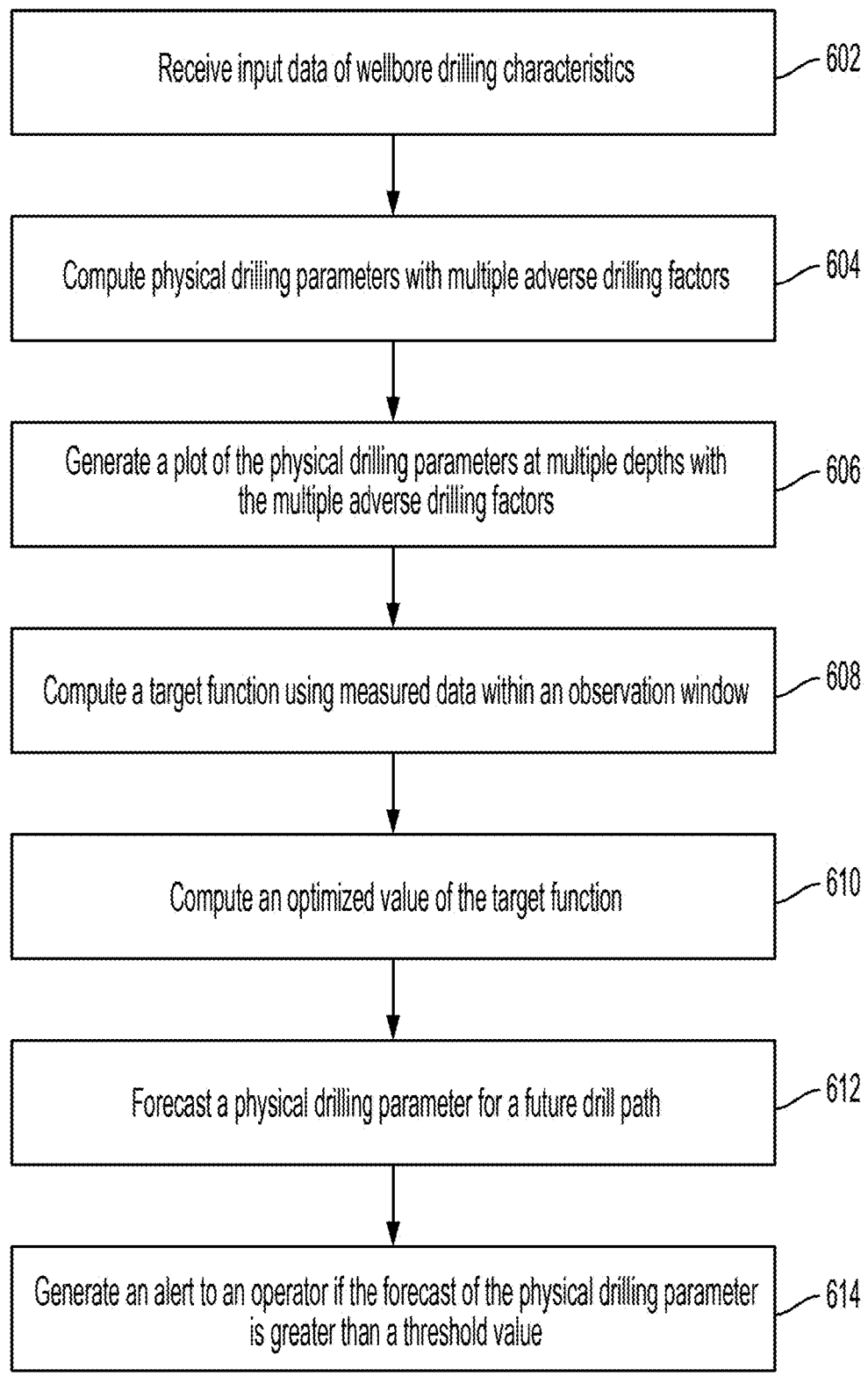
FIG. 6 is a flowchart of a process for forecasting physical drilling parameters for a future drill path, according to some aspects of the disclosure.

FIG. 6 is a flowchart of a process for forecasting physical drilling parameters for a future drill path, according to some aspects of the disclosure. For instance, at block 602, the processing device receives input data of wellbore drilling characteristics, in a manner similar to that described with respect to blocks 302, 402, or 502. In some examples, the input parameters include at least one of string data, casing data, hole data, well path survey information, fluid data, or operation data.

At block 604, the processing device 202 computes physical drilling parameters including one or more of casing wear, drag, or torque factors in a manner similar to that described with respect to blocks 304, 404, or 504. At block 606, the processing device 202 produces plots of the physical drilling parameters in a manner similar to that described with respect to blocks 406, or 506.

At block 608, the processing device 202 computes a target function as described with respect to FIGS. 4-5, but using measured data within an observation window. For instance, the processing device 202 may compute the target function using measured data recorded from the sensor 109 over a previous predetermined time period (e.g., previous 1-hour, previous 4-hours, etc.). The processing device 202 may also use measured data within an adjustable observation window based on the trend of the measured data. For example, the intensity of a trend (i.e., the measured data changes positively or negatively with increasing magnitudes) may be used by the processing device 202 to adjust the observation window.

At block 610, the processing device 202 performs operations to determine multiple projected physical drilling parameters in a manner similar to that described with respect to blocks 308, 408, or 508. At block 612, the processing device 202 forecasts the physical drilling parameters for a future drilling path. For instance, the processing device 202 may predict the hook load, torque, or casing wear for the next observation window (e.g., future 1-hour, previous 4-hours, etc.). The processing device 202 can forecast an increase, decrease, or stability of the physical drilling parameters.

At block 614, the processing device 202 may generate an alert if the forecast physical drilling parameter is greater than a threshold value of the respective physical drilling parameter. In one example, the processing device 202 may also control the drill bit 114 or the kelly 113 to pause or stop the progression of the drilling operation. The processing device 202 may cause the computing device 112 to stop the drilling process to prevent the physical drilling parameter from exceeding the threshold value of the respective physical drilling parameters.

Figure 7:
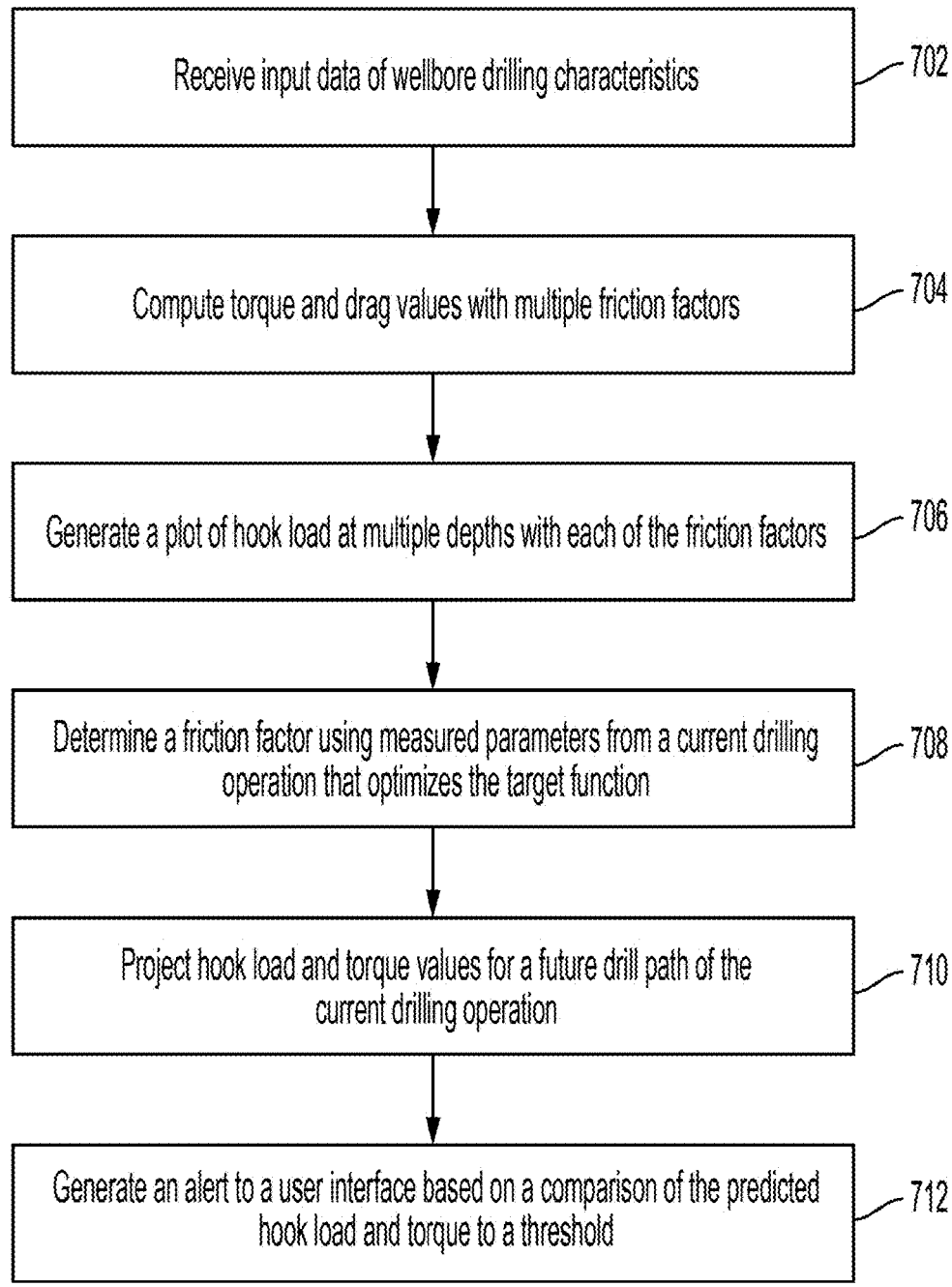
FIG. 7 is a flowchart of a process for projecting hook load and torque values during a drilling operation, according to some aspects of the disclosure.

FIG. 7 is a flowchart of a process for projecting hook load and torque values during a drilling operation, according to some aspects of the disclosure.

For instance, at block 702, the processing device receives input data of wellbore drilling characteristics, in a manner similar to that described with respect to block 402. In some examples, the input parameters include at least one of string data, casing data, hole data, well path survey information, fluid data, or operation data.

At block 704, the processing device 202 computes one or more of drag or torque factors in a manner similar to that described with respect to blocks 304, 404, or 504. At block 706, the processing device 202 produces plots in a manner similar to that described with respect to block 406 executed in a real-time drilling operation.

At block 708, the processing device may determine a friction factor using measured parameters from a current drilling operation that optimizes the target function. The operations at block 708 are substantially similar to the operations described with regard to block 408 executed in a real-time drilling operation.

At block 710, the processing device may predict hook load and torque parameters for a future drill path of the current drilling operation. The operations at block 708 are substantially similar to the operations described with regard to block 408 executed in a real-time drilling operation.

At block 712, the processing device may generate an alert to a user interface based on a comparison of the predicted hook load and torque parameters to threshold hook load and torque values. The operations at block 712 are substantially similar to the operations described with regard to block 412.

Figure 8:
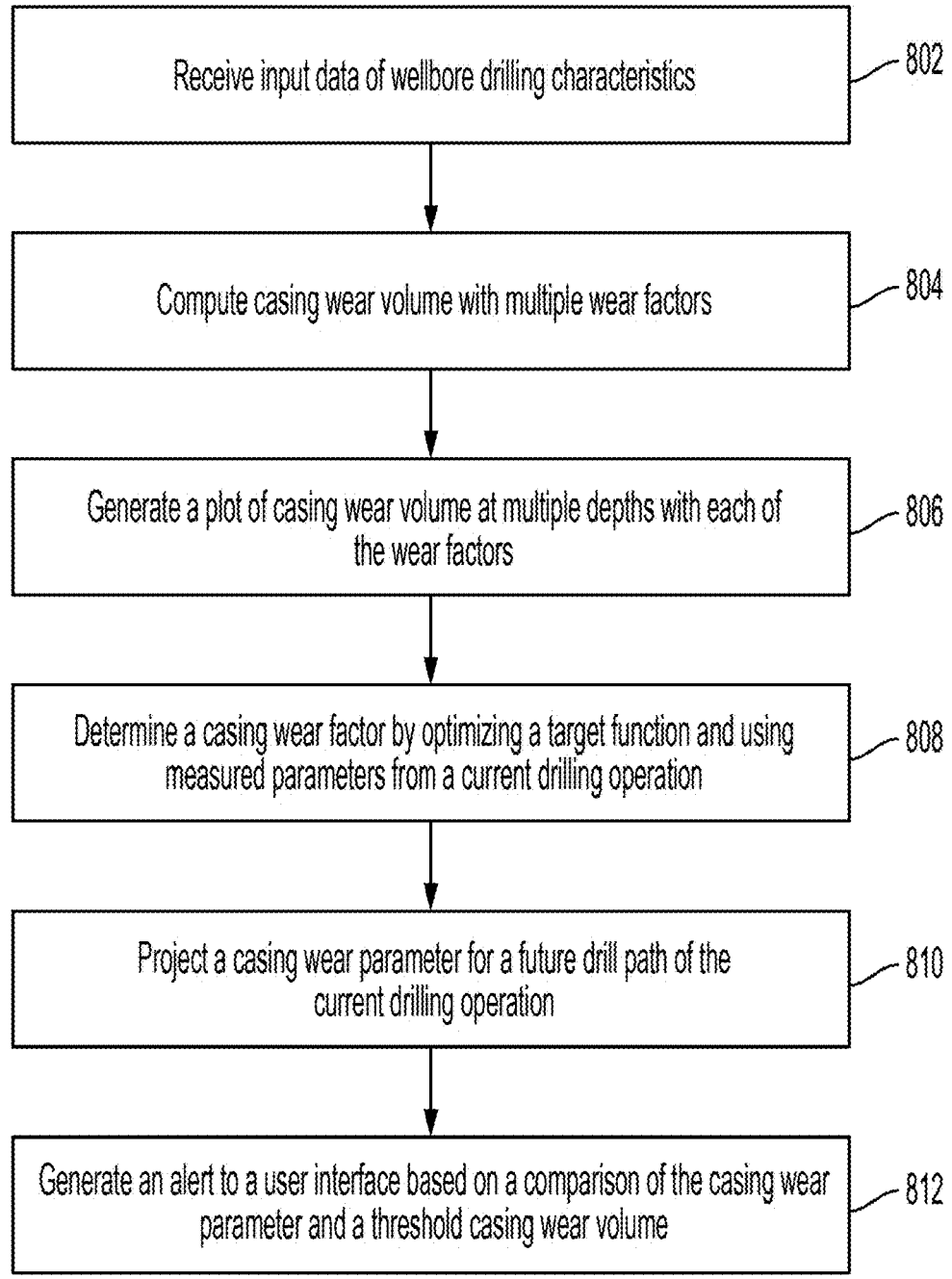
FIG. 8 is a flowchart of a process for projecting casing wear volumes during a drilling operation, according to some aspects of the disclosure.

FIG. 8 is a flowchart of a process for projecting casing wear volumes during a drilling operation, according to some aspects of the disclosure.

For instance, at block 802, the processing device 202 receives input data of wellbore drilling characteristics, in a manner similar to that described with respect to block 802.

In some examples, the input parameters include at least one of string data, casing data, hole data, well path survey information, fluid data, or operation data.

At block 804, the processing device 202 computes a casing wear factor volume with multiple wear factors in a manner similar to that described with respect to block 504. At block 806, the processing device 202 produces plots in a manner similar to that described with respect to block 506, executed in a real-time drilling operation.

At block 808, the processing device may determine a casing wear factor by optimizing a target function using measured parameters from a current drilling operation. The operations at block 808 are substantially similar to the operations described with regard to block 508 executed in a real-time drilling operation.

At block 810, the processing device may predict a casing wear parameter for a future drill path of the current drilling operation. The operations at block 708 are substantially similar to the operations described with regard to block 808 executed in a real-time drilling operation.

At block 812, the processing device may generate an alert to a user interface based on a comparison of the predicted casing wear parameter to threshold casing wear volume. The operations at block 812 are substantially similar to the operations described with regard to block 812.

In some aspects, a system for predictive friction and wear estimation is provided according to one or more of the following examples.

As used below, any reference to a series of examples is to be understood as a reference to each of those examples disjunctively (e.g., "Examples 1-4" is to be understood as "Examples 1, 2, 3, or 4").

Example 1 is a system comprising: a processor; and a non-transitory memory device communicatively coupled to the processor comprising instructions that are executable by the processor to cause the processor to perform operations comprising: receiving input data at least in part for an offset wellbore, the input data including a plurality of downhole measures of downhole condition; applying Bayesian optimization to a model incorporating the input data, the Bayesian optimization using varying values for an adverse drilling factor to produce a target function; determining a minimum value for the target function; providing a projected value for a physical drilling parameter based on the minimum value; determining that the projected value for the physical drilling parameter exceeds a prescribed limit; and in response to determining that the projected value for the physical drilling parameter exceeds the prescribed limit, generating an alert.

Example 2 is the system of example 1 wherein the adverse drilling factor comprises a friction factor and the target function includes torque and drag.

Example 3 is the system of example 1 wherein the adverse drilling factor comprises a casing wear factor and the target function includes at least one of a casing wear volume or a groove depth.

Example 4 is the system of examples 1-3 wherein the physical drilling parameter is a real-time drilling parameter and generating the alert comprises generating an alarm responsive to determining that the projected value exceeds the prescribed limit over a selected time interval.

Example 5 is the system of example 4 wherein the operations further comprise in response to generating the alert, using the processor to stop a drilling tool.

Example 6 is the system of example 4 wherein the operations further comprise adjusting a parameter of a drill bit to reduce the physical drilling parameter to a value less than the prescribed limit.

Example 7 is the system of examples 1-3 wherein the physical drilling parameter is a static drilling factor and generating the alert comprises prompting a user for an alteration to a well design.

Example 8 is a method of predictive friction and wear estimation for wellbore drilling, the method comprising: receiving, by a processing device, input data at least in part for an offset wellbore, the input data including a plurality of downhole measures of downhole condition; applying, by the processing device, Bayesian optimization to a model incorporating the input data, the Bayesian optimization using varying values for an adverse drilling factor to produce a target function; determining a minimum value for the target function; providing, by the processing device, a projected value for physical drilling parameters based on the minimum value; and determining that the projected value for the physical drilling parameters exceeds a prescribed limit; and in response to determining that the projected value for the physical drilling parameters exceeds the prescribed limit, generating an alert.

Example 9 is the method of example 8 wherein the adverse drilling factor comprises a friction factor and the target function includes torque and drag.

Example 10 is the method of example 8 wherein the adverse drilling factor comprises a casing wear factor and the target function includes at least one of a casing wear volume or a groove depth.

Example 11 is the method of example 8-10 wherein the physical drilling parameters is a real-time drilling parameter and generating the alert comprises generating an alarm responsive to determining that the projected value exceeds the prescribed limit over a selected time interval.

Example 12 is the method of example 11 further comprising stopping a drilling tool responsive to the alarm.

Example 13 is the method of examples 8-11 wherein the adverse drilling factor is a static drilling factor and generating the alert comprises prompting a user for an alteration to a well design.

Example 14 is a non-transitory computer-readable medium that includes instructions that are executable by a processing device for causing the processing device to perform operations related providing adverse drilling factor projection, the operations comprising: receiving input data at least in part for an offset wellbore, the input data including a plurality of downhole measures of downhole condition; applying Bayesian optimization to a model incorporating the input data, the Bayesian optimization using varying values for an adverse drilling factor to produce a target function; determining a minimum value for the target function; providing a projected value for physical drilling parameters based on the minimum value; and determining that the projected value for the physical drilling parameters exceeds a prescribed limit; and in response to determining that the projected value for the physical drilling parameters exceeds the prescribed limit, generating an alert.

Example 15 is the non-transitory computer-readable medium of example 14 wherein the adverse drilling factor comprises a friction factor and the target function includes torque and drag.

Example 16 is the non-transitory computer-readable medium of example 14 wherein the adverse drilling factors comprises a casing wear factor and the target function includes at least one of a casing wear volume or a groove depth.

Example 17 is the non-transitory computer-readable medium of examples 14-16 wherein the physical drilling parameters is a real-time drilling parameter and generating the alert comprises generating an alarm responsive to determining that the projected value exceeds the prescribed limit over a selected time interval.

Example 18 is the non-transitory computer-readable medium of example 17 wherein the operations further comprise stopping a drilling tool.

Example 19 is the non-transitory computer-readable medium of example 17 wherein the operations further comprise adjusting a parameter of a drill bit to reduce the a physical drilling parameter of the physical drilling parameters to a value less than the prescribed limit.

Example 20 is the non-transitory computer-readable medium of examples 14-16 wherein the adverse drilling factor is a static drilling factor and generating the alert comprises prompting a user for an alteration to a well design.

The foregoing description of the examples, including illustrated examples, has been presented only for the purpose of illustration and description and is not intended to be exhaustive or to limit the subject matter to the precise forms disclosed. Numerous modifications, combinations, adaptations, uses, and installations thereof can be apparent to those skilled in the art without departing from the scope of this disclosure. The illustrative examples described above are given to introduce the reader to the general subject matter discussed here and are not intended to limit the scope of the disclosed concepts.

What is claimed is:

1. A system comprising:
a processor; and
a non-transitory memory device communicatively coupled to the processor comprising instructions that are executable by the processor to cause the processor to perform operations comprising:
receiving input data at least in part for an offset wellbore, the input data including a plurality of downhole measures of downhole condition;
applying Bayesian optimization to a model incorporating the input data, the Bayesian optimization using varying values for an adverse drilling factor to produce a target function that includes groove depth that is based on casing wear volume, the adverse drilling factor comprising a casing wear factor that is based on a friction factor;
determining a minimum value for the target function by minimizing a root-mean-square target function including the groove depth;
generating a projected value for a physical drilling parameter of a drilling operation based on the minimum value, the projected value indicating an efficacy of the drilling operation;
determining that the projected value for the physical drilling parameter exceeds a prescribed limit; and
in response to determining that the projected value for the physical drilling parameter exceeds the prescribed limit, adjusting the physical drilling parameter of a drilling tool to conform to the projected value to control the drilling operation.

2. The system of claim 1 wherein the target function includes torque and drag.

3. The system of claim 1 wherein the physical drilling parameter is a real-time drilling parameter, and wherein the operations further comprise generating an alarm responsive to determining that the projected value exceeds the prescribed limit over a selected time interval.

4. The system of claim 3 wherein the operations further comprise adjusting a parameter of a drill bit to reduce the physical drilling parameter to a value less than the prescribed limit.

5. The system of claim 1 wherein the physical drilling parameter is a static drilling factor, and wherein the operations further comprise prompting a user for an alteration to a well design.

6. A method of predictive friction and wear estimation for wellbore drilling, the method comprising:
receiving, by a processing device, input data at least in part for an offset wellbore, the input data including a plurality of downhole measures of downhole condition;
applying, by the processing device, Bayesian optimization to a model incorporating the input data, the Bayesian optimization using varying values for an adverse drilling factor to produce a target function that includes groove depth that is based on casing wear volume, the adverse drilling factor comprising a casing wear factor that is based on a friction factor;
determining a minimum value for the target function by minimizing a root-mean-square target function including the groove depth;
generating, by the processing device, a projected value for physical drilling parameter of a drilling operation based on the minimum value, the projected value indicating an efficacy of the drilling operation; and
determining that the projected value for the physical drilling parameter exceeds a prescribed limit; and
in response to determining that the projected value for the physical drilling parameter exceeds the prescribed limit, adjusting the physical drilling parameter of a drilling tool to conform to the projected value to control the drilling operation.

7. The method of claim 6 wherein the target function includes torque and drag.

8. The method of claim 6 wherein the physical drilling parameter is a real-time drilling parameter, and wherein the method further comprises generating an alarm responsive to determining that the projected value exceeds the prescribed limit over a selected time interval.

9. The method of claim 6 wherein the adverse drilling factor is a static drilling factor, and wherein the method further comprises prompting a user for an alteration to a well design.

10. A non-transitory computer-readable medium that includes instructions that are executable by a processing device for causing the processing device to perform operations related to providing adverse drilling factor projection, the operations comprising:
receiving input data at least in part for an offset wellbore, the input data including a plurality of downhole measures of downhole condition;
applying Bayesian optimization to a model incorporating the input data, the Bayesian optimization using varying values for an adverse drilling factor to produce a target function that includes groove depth that is based on casing wear volume, the adverse drilling factor comprising a casing wear factor that is based on a friction factor;
determining a minimum value for the target function by minimizing a root-mean-square target function including the groove depth;
generating a projected value for physical drilling parameter of a drilling operation based on the minimum value, the projected value indicating an efficacy of the drilling operation; and determining that the projected value for the physical drilling parameter exceeds a prescribed limit; and in response to determining that the projected value for the physical drilling parameter exceeds the prescribed limit, adjusting the physical drilling parameter of a drilling tool to conform to the projected value to control the drilling operation.

11. The non-transitory computer-readable medium of claim 10 wherein the target function includes torque and drag.

12. The non-transitory computer-readable medium of claim 10 wherein the physical drilling parameter is a real-time drilling parameter, and wherein the operations further comprise generating an alarm responsive to determining that the projected value exceeds the prescribed limit over a selected time interval.

13. The non-transitory computer-readable medium of claim 12 wherein the operations further comprise adjusting a parameter of a drill bit to reduce the physical drilling parameter to a value less than the prescribed limit.

14. The non-transitory computer-readable medium of claim 10 wherein the adverse drilling factor is a static drilling factor, and wherein the operations further comprise prompting a user for an alteration to a well design.

* * * * *